United States Patent [19]
Morimoto et al.

[11] 4,241,281
[45] Dec. 23, 1980

[54] LIGHT EMITTING DIODE DISPLAY DEVICE

[75] Inventors: Kiyoshi Morimoto; Hiroshi Watanabe, both of Mobara, Japan

[73] Assignee: Futaba Denshi Kogyo Kabushiki Kaisha, Chiba, Japan

[21] Appl. No.: 4,536

[22] Filed: Jan. 18, 1979

[30] Foreign Application Priority Data

Jan. 31, 1978 [JP] Japan ................................. 53-8807

[51] Int. Cl.³ .......................................... H01L 33/00
[52] U.S. Cl. .................................. 315/161; 313/500; 315/164; 357/17
[58] Field of Search ............. 315/161, 166, 164, 176, 315/169.1, 169.3; 313/500; 357/17, 48; 331/94.5 H

[56] References Cited

U.S. PATENT DOCUMENTS

| | | | |
|---|---|---|---|
| 3,893,149 | 7/1975 | Grenon | 313/500 X |
| 4,012,243 | 3/1977 | Keil et al. | 357/17 X |
| 4,152,711 | 5/1979 | Nakata | 357/17 |

Primary Examiner—Eugene R. LaRoche
Attorney, Agent, or Firm—Oblon, Fisher, Spivak, McClelland & Maier

[57] ABSTRACT

A light emitting diode display device is disclosed having a semiconductor substrate of a predetermined conductivity type, semiconductor films provided on the substrate and having a conductivity type opposite to that of the substrate, light emitting diode elements provided on the semiconductor films and each having a P-N junction, the above-mentioned semiconductor films functioning as first electrodes for the light emitting diode elements, second electrodes each provided on the upper surface of each light emitting diode element, and means for applying a reverse bias between the substrate and the first electrodes thereby to isolate the light emitting diode from one another.

5 Claims, 5 Drawing Figures

LIGHT EMITTING DIODE DISPLAY DEVICE

BACKGROUND OF THE INVENTION

1. Field of the Invention

The present invention relates to a display device and, more particularly, to a light emitting diode display device which can facilitate mounting of electrodes and isolation of each light emitting diode element.

2. Description of the Prior Art

It is well known that display devices for visually displaying characters, numeric characters, graphic symbols and the like are divided into two types, namely hybrid and monolithic. In the hybrid type display device, a plurality of light emitting diode chips of predetermined shapes are arranged on a single substrate. In the monolithic type display device, necessary light-emitting diodes are formed in a semiconductor crystal substrate.

In the case of the hybrid type display device, materials can be economically used and a relatively large-scale display can be performed. However, the production process is very complicated and reliability is limited. In addition, luminance tends to vary with the light emitting diode chip and therefore the quality of display leaves much to be desired.

In the case of the monolithic type display device, on the other hand, fine and close display patterns can be easily formed by the use of hot etching or the like and a great number of light emitting regions can be simultaneously formed. Therefore, the display device of this type is suitable for mass production and can almost eliminate variation in the luminance of each light-emitting region. For this reason, the display device of this type is widely used in the display sections of desk computers, wrist watches, measuring instruments and the like.

In producing the above-mentioned monolithic type display device, it is necessary to provide a process for electrically and optically isolating each light-emitting diode formed in a single semiconductor crystal substrate and also a process for forming electrodes and leads for giving drive voltage to each light emitting diode element.

In the case of the conventional monolithic type display device, isolation of each diode element is usually achieved by the following methods:

One is the method in which predetermined regions on the substrate on which P-N junctions are formed are removed by etching and dicing to form a plurality of isolated light emitting diode elements according to the display pattern. The other is the method in which impurities are selectively diffused in the predetermined regions of the substrate to give them a conductivity type opposite to that of the substrate thereby forming a plurality of isolated light emitting diode elements.

In addition, there is proposed a method which bombards the predetermined regions of the substrate with high-energy electrons or protons to make them amorphous so that they are utilized as isolated layers.

However, the above-mentioned conventional methods require complicated processes for the isolation of elements or large-sized expensive apparatuses therefor.

As mentioned above, the isolated elements by the above methods require the formation of electrodes and the connection of leads. For this purpose, vacuum deposition, wire bonding or the like is usually employed. In this case, however, when an increased number of light emitting diode elements must be provided on a single substrate or when the light emitting diode elements are arranged at a close interval in order to perform fine and close display, the processes for forming the electrodes and attaching the leads become very complicated and thereby the yield of production is lowered.

BRIEF SUMMARY OF THE INVENTION

The present invention is intended to eliminate the above-mentioned disadvantages of the prior art.

Therefore, it is an object of the present invention to provide a light emitting diode display device which can produce a high-quality display without variation of luminance.

It is another object of the present invention to provide a light emitting diode display device which can be produced very easily and inexpensively by simplifed processes.

It is still another object of the present invention to provide a light emitting diode display device in which electrodes can be easily formed and leads can be easily connected.

It is a further object of the present invention to provide a light emitting diode display device in which isolation of light emitting diode elements can be perfectly achieved.

According to the present invention, there is provided a light emitting diode display device which comprises a semiconductor substrate having a predetermined conductivity type, semiconductor films provided on a surface of the substrate and having a conductivity type opposite to that of the substrate, light emitting diode elements provided on the semiconductor films and each having a P-N junction, the semiconductor films functioning as first electrodes for the light emitting diode elements, second electrodes each provided on the upper surface of each light emitting diode element, and means for applying a reverse bias between the substrate and the first electrodes thereby to isolate the light emitting diode elements from one another.

BRIEF DESCRIPTION OF THE ACCOMPANYING DRAWINGS

DETAILED DESCRIPTION OF THE PREFERRED EMBODIMENTS

A preferred embodiment of the present invention will be hereinafter described with reference to the drawings.

Figure 1:
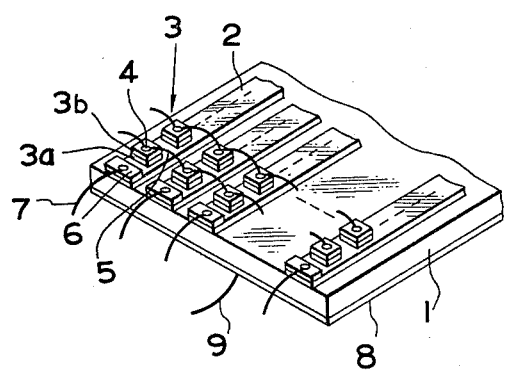
FIG. 1 is a perspective view of the essential part of a light emitting diode display device according to a preferred embodiment of the present invention.

FIG. 1 is a fragmentary perspective view of the essential portion of a light emitting diode display device according to a preferred embodiment of the present invention.

In FIG. 1, reference numeral 1 designates a semiconductor substrate. The semiconductors that can be used for forming the substrate 1 include binary or ternary III–V compound semiconductors such as GaAs, GaP, GaAsP, GaAlAs and GaInP which display light-emitting-diode characteristics, binary or ternary II–VI compound semiconductors such as CdTe, ZnSeTe and CdMgTe, and element semiconductors such as germanium (Ge) and silicon (Si) similar in lattice constant and thermal expansion coefficient to GaAs and GaAsP and to GaP respectively.

In this example, the substrate 1 is made of P-type silicon (Si) while each light emitting diode element is formed of GaP. The light emitting diode elements are arrayed on the substrate 1 in the form of a matrix so as to visually display characters, graphic forms and the like.

Reference numeral 2 designates first electrodes for light emitting diode elements to be later described, which are disposed on the predetermined areas of the surface of the substrate 1 in the form of, for instance, stripes and which are formed of semiconductor films opposite in conductivity type to the substrate 1, or, in this example, formed of N-type silicon films. These first electrodes 2 may be formed by growing monocrystalline N-type silicon using liquid phase epitaxy, vapor phase epitaxy, ion plating, cluster ion beam epitaxial growth or the like. Also, the first electrodes 2 may be formed by diffusing phosphorus, antimony or the like (which forms donors when contained in silicon) selectively into the predetermined regions of the surface of the substrate 1 to a high concentration.

Reference numeral 3 designates light emitting diode elements formed on the above-mentioned first electrodes 2. The light emitting diode elements may be formed by the following method:

First formed on the first electrodes 2 by epitaxial growth are first semiconductor films 3a having the same conductivity type as the first electrodes 2, or, in this example, made of N-type GaP. Then formed on the respective first semiconductor films 3a by epitaxial growth or diffusion are second semiconductor films 3b made of P-type GaP and each forming a P-N junction with each first semiconductor film 3a.

In addition, on the second semiconductor film 3b of each light emitting diode element 3 formed by, for instance, vacuum deposition is a second electrode 4 made of, for instance, Au-Be in ohmic contact with P-type GaP.

The light emitting diode elements 3 arranged on the first electrodes 2 in the form of a matrix and each consisting of the first and second semiconductor layers or films 3a and 3b are electrically connected on a column-by column basis by fixing leads 5 on the second electrodes 4 by bonding. In other words, the light emitting diode elements 3 arranged along each matrix column vertical to the first electrode 2 are electrically connected together by each lead 5 through the second electrodes 4.

Reference numeral 6 designates an ohmic-contact section provided on each first electrode 2 for connecting the first electrode 2 to a lead 7 for power supply. When the first electrode 2 is made of silicon as in this example, the ohmic-contact section 6 is formed of aluminum or the like by vacuum deposition.

Reference numeral 8 designates an ohmic-contact section provided on the rear surface of the substrate 1 so as to connect a lead 9 thereto. The lead 9 is used for applying a reverse bias to between the substrate 1 and the first electrodes 2.

In short, the light emitting diode array according to the present invention may be formed as follows:

When the substrate 1 is made of a P-type semiconductor as in the above-mentioned example, N-type, N-type and P-type semiconductor layers or films are grown on the predetermined regions of the surface of the substrate 1 in succession by epitaxial growth or diffusion or the like to form a basic four-layer PNNP structure. Among these four layers, the layer (N-type semiconductor layer, in this example) first formed directly on the substrate 1 is used as the first electrode of the light emitting diode element formed thereon.

The driving power supply system for driving the light emitting diode array constructed as above will be described hereinafter with reference to FIG. 2.

In order to electrically isolate the first electrodes 2, which are arranged on the substrate 1 in the form of stripes and in the direction of the rows of the matrix, from the substrate 1 or, in other words, in order to electrically isolate each of the electrodes 2, a reverse bias is supplied between the substrate 1 and the electrodes 2. In this example, since the substrate 1 is of a P-type semiconductor and the electrodes 2 are of an N-type semiconductor, a bias power supply 11 is connected at its negative side to the substrate 1 and at its positive side to each electrode 2 so that a reverse bias is applied to the junction between the substrate 1 and each electrode 2.

In order to drive the light emitting diode elements 3, meanwhile, the semiconductor layers 3a and 3b are forward-biased by driving power supplies 12 through the leads 5 and 7 and the electrodes 4 and 6.

Thus, the electrodes 2 are electrically isolated from one another by the bias power supplies 11. As a result, only the light emitting diode element or elements postioned at the point or points where the selected electrode or electrodes 2 cross the lead or leads 5 are made to emit light.

Figure 2:
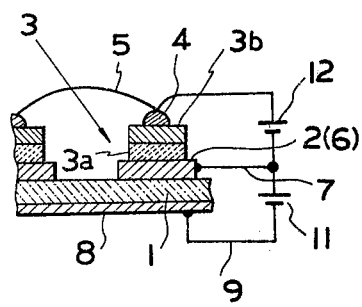
FIG. 2 is a sectional view thereof.

In the driving system shown in FIG. 2, the bias power supplies 11 are required to be separate from the driving power supplies 12 for the light emitting diode elements 3. In addition, the number of the power supplies 11 required corresponds to that of the electrodes 2. Therefore, when it is required to provide a great number of light emitting diode elements 3, the display device, or array, becomes very complicated and expensive.

Figure 3:
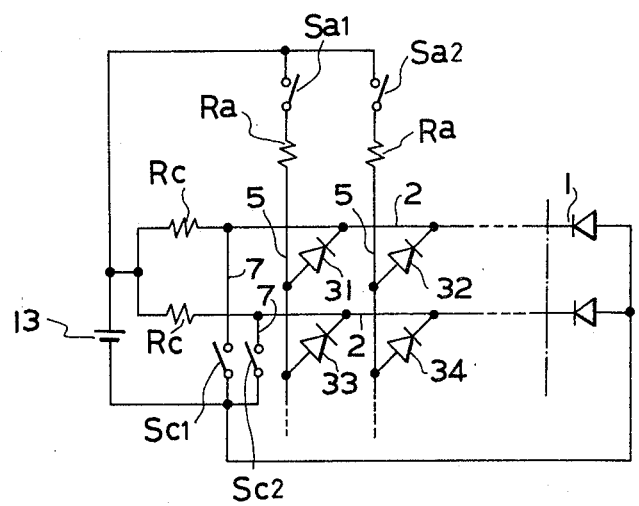
FIG. 3 is the diagram of a driving circuit for the preferred embodiment shown in FIGS. 1 and 2.

Accordingly, the inventors have developed a driving power supply system in which the bias power supply and the driving power supply are combined into the same power supply by connecting the light emitting diode elements 3 to one another through switches and resistors as shown in FIG. 3 and which can effectively perform the driving of the light emitting diode elements 3 and electrical isolation therebetween.

As shown in FIG. 3, the lead 5 connected to the anode (or the semiconductor layer 3b side, in the example shown in FIGS. 2 and 3 of each of the light emitting diode elements 3 (31, 32, . . . ) is connected to the positive side of a power supply 13 through each protective resistor Ra and each of switches Sa (Sa$_1$, Sa$_2$, . . . ) inserted in series.

Meanwhile, the electrodes 2 connected to the cathode (or the semiconductor layer 3a side, in the example shown in FIGS. 1 and 2) of each light emitting diode element 3 are connected to the positive side of the power supply 13 through the leads 7 and resistors Rc. In addition, each electrode 2 is separately connected to the negative side of the power supply 13 through the leads 7 and each of switches Sc (Sc$_1$, Sc$_2$, . . . ). Also, the negative side of the power supply 13 is connected to the substrate 1.

According to the system mentioned above, the power supply 13 is inserted between the electrode 2 and the substrate 1 through the resistor Rc in the reverse-biasing direction, and therefore, as long as the switch Sc is kept open, the substrate 1 is electrically isolated from the electrodes 2 and, as a result, the electrodes 2 are kept isolated from one another.

When the switches $Sa_1$ and $Sc_1$ are closed in order to made the light emitting diode element 31 emit light, the particular electrode 2 on which the light emitting diode element 31 is formed is electrically connected to the substrate 1 through the switch $Sc_1$ and the lead 9, while a reverse bias is maintained to between the other electrodes 2 and the substrate 1 by the power supply 13 and therefore the above-mentioned particular electrode 2 selected by closing the switch $Sc_1$ is kept isolated from the other electrodes 2.

Meanwhile, closing of the switch $Sc_1$ causes the cathode of the light emitting diode element 31 to be electrically connected to the negative side of the power supply 13. In addition, closing of the switch $Sa_1$ causes the anode of the light emitting diode element 31 to be electrically connected to the positive side of the power supply 13 through the resistor Ra, and, therefore, only the light emitting diode element 31 is forward-biased to emit light.

Thus, if the circuit system shown in FIG. 3 is applied to the driving power supply system as mentioned above, both electrical isolation between the substrate 1 and the electrodes 2 and driving of the light emitting diode elements 3 can be performed by the single power supply 13.

In the above-mentioned preferred embodiment shown in FIGS. 1 and 2, each space between the light emitting diode elements 3 is left intact. In this state, however, there is a possibility of the occurance of the so-called cross-talk phenomenon in which the light emitted from each excited light-emitting diode element 3 enters the other light emitting diode elements 3 which are not emitting light, and thereby the latter are seen as if they were emitting light. In order to completely prevent the above-mentioned crosstalk phenomenon, the above-mentioned space between the light emitting diode elements 3 may be filled with an optically opaque insulating material. If the space is filled up with this insulating material to the level substantially flush with the upper surface of each light emitting diode element 3 to form a substantially flat surface, it becomes possible to simultaneously connect the leads 5 to the electrodes 4 on the semiconductor films or layers 3b of the light emitting diode elements 3 by, for instance, vacuum deposition. In this manner, the production of the light emitting diode array is further simplified.

Also, in the preferred embodiment shown in FIGS. 1 and 2, an N-type semiconductor is used as the first electrode 2 of the light emitting diode element 3 when the P-type substrate 1 is used, and therefore, when current flows through the electrode 2, the voltage drop across the electrode 2 is larger than that in the case of an electrode made of conductive material, as metal.

If, for instance, a large number of elements 3 are required and therefore the electrode 2 is long, the voltage drop becomes large at a point distant from the power-feeding end, or the ohmic-contact section 6, at which the driving voltage is applied to the electrode 2. As a result, the voltage applied to each light emitting diode element 3 varies and therefore the luminance varies with the element 3.

Figure 4:
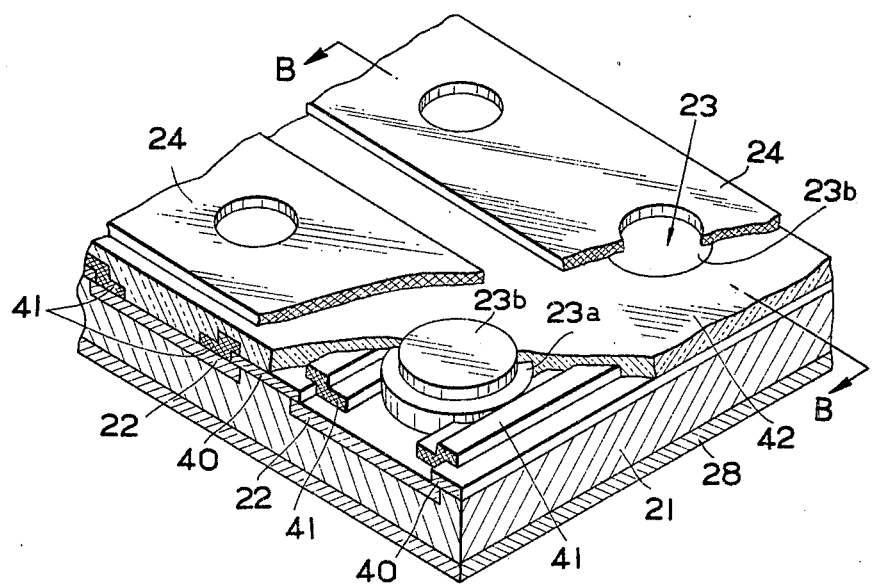
FIG. 4 is a fragmentary perspective view of the essential part of a light emitting diode array according to another preferred embodiment of the present invention.
Figure 5:
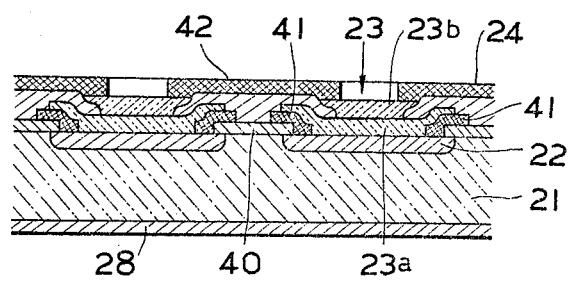
FIG. 5 is a fragmentary sectional view thereof.

In order to prevent the above-mentioned disadvantages, a highly conductive material such as metal may be deposited along each electrode 2, as shown in another preferred embodiment of the present invention illustrated in FIGS. 4 and 5.

As with the preferred embodiment shown in FIGS. 1 and 2, the preferred embodiment shown in FIGS. 4 and 5 uses a P-type silicon substrate on which light emitting diode elements are provided in the form of a matrix.

In FIGS. 4 and 5, reference numeral 21 designates a substrate made of, for instance, P-type silicon. First electrodes 22 are "N+"-type films or layers provided in the predetermined regions of the substrate 21 in the form of stripes and formed by doping the silicon with impurities such as P and Sb (which forms donors when contained in Si) in a high concentration by a selective heat diffusion process. First insulating films or layers 40 are provided on the substrate 21 in the form of stripes so that they span any two adjacent ones of the electrodes 22. Electrode conductors 41 are provided on the substrate 21 so that they are insulated from the substrate 21 by means of the first insulating films or layers 40 and in ohmic contact with the electrodes 22 having openings at the predetermined regions in which the light emitting diodes elements are arranged.

First semiconductor films 23a are formed on the electrodes 22 by growing N-type GaP thereon by epitaxial growth. The semiconductor films 23a, for instance, dot-shaped. A second insulating layer 42 is provided so as to surround the periphery of each semiconductor film 23a.

On the portion of the upper surface of each semiconductor film 23a where the second insulating layer or film 42 is not formed, there is provided a second semiconductor film or layer 23b formed by epitaxially growing P-type GaP which forms a PN junction with the semiconductor film 23a. Thus, the semiconductor films or layers 23a and 23b form each light emitting diode element 23.

Second electrodes 24 with predetermined openings are provided on the second insulating layer 42 at right angles with the first electrodes 22 so that they are in ohmic contact with the semiconductor films 23b. An ohmic contact section 28 is provided on the rear surface of the substrate 21 so that it is in ohmic contact with the substrate 21. Besides, leads (not shown) are connected to the above-mentioned electrode conductors 41, electrodes 24 and ohmic contact section 28. Thus, the light emitting diode array of the present invention is formed.

In the light emitting diode array shown in FIGS. 4 and 5, the electrode conductor 41 is provided on each electrode 22 throughout its entire length, and therefore the electrode 22 is kept at substantially the uniform potential throughout its entire length. Accordingly, luminance does not vary with the light emitting diode element 23, and therefore uniform emission of light can be obtained even when the number of the light emitting diode elements 23 increases. Besides, as mentioned above, the first and second insulating layers or films 40 and 42 are provided between the light emitting diode elements 23, and, therefore, the second electrodes 24 can be easily formed by, for instance, vacuum deposition.

In the preferred embodiments shown in FIGS. 1 and 2 and FIGS. 4 and 5, description is made of the light emitting diode array in which the light emitting diode elements are arranged in the form of a matrix. However, the present invention is not limited to such a matrix type display device. For instance, segment-shaped light emitting diode elements may be arranged on the substrate in the form of the FIG. 8 to display numeric characters.

As mentioned above, the light emitting diode array of the present invention has a semiconductor substrate, semiconductor regions formed on the substrate and opposite in conductivity type to the substrate, and light emitting diode elements formed on the semiconductor regions, the semiconductor regions functioning as first electrodes for the light emitting diode elements.

With the above-mentioned construction, the process for forming the electrodes can be very easily performed. Besides, the electrodes are made of semiconductive materials, and, therefore, the processes from the formation of electrodes to the formation of light emitting diode elements can be integratedly performed. As a result, production of the light emitting diode array can be very much simplified. In addition, according to the present invention, the light emitting diode array of the matrix type, segment type or any other types can be easily produced. Thus, the present invention has a great effect on the improvement of productivity, widening of the scope of application, and the like.

Besides, in the light emitting diode array according to the present invention, electrical isolation of the light emitting diode elements from one another can be effectively made by a circuit means which applies a reverse bias to between the electrode and the substrate. This method eliminates the need for performing the troublesome processes as etching and dicing which are required for producing the conventional display devices. Thus, the materials are effectively used and therefore low-cost production can be performed. Accordingly, the light emitting diode array of the present invention can be made high in quality and low in cost.

Obviously many modifications and variations of the present invention are possible in the light of the above teachings. It is therefore to be understood that within the scope of the appended claims the invention may be practiced otherwise than as specifically described.

What is claimed as new and desired to be secured by letters patent of the United States is:

1. A light emitting diode display device which comprises a substrate having a predetermined conductivity type, first electrodes each consisting of a semiconductor region formed in a predetermined region on a surface of said substrate and having a conductivity type opposite to that of said substrate, first semiconductor films formed on said first electrodes and having the same conductivity type as said first electrodes, second semiconductor films formed on said first semiconductor films and forming P-N junctions with said first semiconductor films respectively so as to form a plurality of light emitting diode elements isolated from one another, and second electrodes formed on said second semiconductor films respectively.

2. The light emitting diode display device as set forth in claim 1, wherein a space between each of said light emitting diode elements is filled up with insulating material.

3. The light emitting diode display device as set forth in claim 1, further comprising electrode conductors formed on predetermined regions of said first electrodes respectively so as to give a substantially uniform driving voltage to the portion of each first electrode where at least a plurality of said light emitting diode elements are formed.

4. The light emitting diode display device as set forth in claim 1, further comprising a driving power supply system for supplying a reverse bias between said substrate and said first electrodes and for supplying a driving voltage between said first and second electrodes so as to drive said light emitting diode elements.

5. The light emitting diode display device as set forth in claim 4, wherein said driving power supply system has a single power supply serving both as a biasing power supply for supplying said reverse bias and as a driving power supply for suppling said driving voltage.

* * * * *